United States Patent [19]

Kakehi et al.

[11] Patent Number: 4,943,361
[45] Date of Patent: Jul. 24, 1990

[54] PLASMA TREATING METHOD AND APPARATUS THEREFOR

[75] Inventors: Yutaka Kakehi, Hikari; Yutaka Omoto, Kudamatsu; Takeshi Harada, Chiyoda, all of Japan

[73] Assignee: Hitachi, Ltd., Tokyo, Japan

[21] Appl. No.: 289,512

[22] Filed: Dec. 27, 1988

Related U.S. Application Data

[63] Continuation of Ser. No. 3,026, Jan. 13, 1987, abandoned.

[30] Foreign Application Priority Data

Jan. 17, 1986 [JP] Japan ............................... 61-6439
Sep. 5, 1986 [JP] Japan ............................. 61-207881

[51] Int. Cl.$^5$ ............................................. C23C 14/34
[52] U.S. Cl. ........................ 204/192.32; 204/298.16; 204/298.19; 204/298.2; 204/298.22; 204/298.31; 204/298.37; 156/345
[58] Field of Search ............... 204/192.32, 192.35, 204/192.37, 298 ME, 298 MM, 298 PM, 298 CX, 298 E, 298 EE; 156/345, 643

[56] References Cited

U.S. PATENT DOCUMENTS

| | | | |
|---|---|---|---|
| 4,158,589 | 6/1979 | Keller et al. | 204/298 X |
| 4,340,462 | 7/1982 | Koch | 204/298 |
| 4,444,643 | 4/1984 | Garrett | 204/298 |
| 4,552,639 | 11/1985 | Garrett | 204/298 |
| 4,557,819 | 12/1985 | Meacham et al. | 204/298 |
| 4,572,759 | 2/1986 | Benzing | 204/298 X |
| 4,632,719 | 12/1986 | Chow et al. | 204/298 X |

Primary Examiner—Nam X. Nguyen
Attorney, Agent, or Firm—Antonelli, Terry, Stout & Kraus

[57] ABSTRACT

The present invention relates to a plasma treating method and apparatus therefor, wherein a plasma treating method is carried out in which an electric field is generated between the electrodes of parallel plate electrodes (anode and cathode), and a magnetic field starting from the anode side, toward the cathode side, the other of said parallel plate electrodes, and back to the anode side, is used. The magnetic field has relatively short lines of magnetic force where it orthogonally intersects the electric field, near the cathode, as compared to that of lines of magnetic force parallel to the electric field, so as to make a cycloidal motion of electrons restricted and to cause mainly a cyclotronic motion of electrons to occur in large quantities. A power supply is connected to the cathode, one of said parallel plate electrodes, and a magnetic field generating means is provided on the anode side, the other of said parallel plate electrodes, at the counter-cathode side thereof, the said magnetic field generating means having NS poles in proximity to each other to provide the previously discussed magnetic lines of force, so as to make the cycloidal motion of electrons restricted and to cause the cyclotronic motion of electrons to occur in large quantities. By use of such method and apparatus, it is made possible to facilitate a treatment of a specimen at a high rate and uniformly without damaging the specimen.

16 Claims, 7 Drawing Sheets

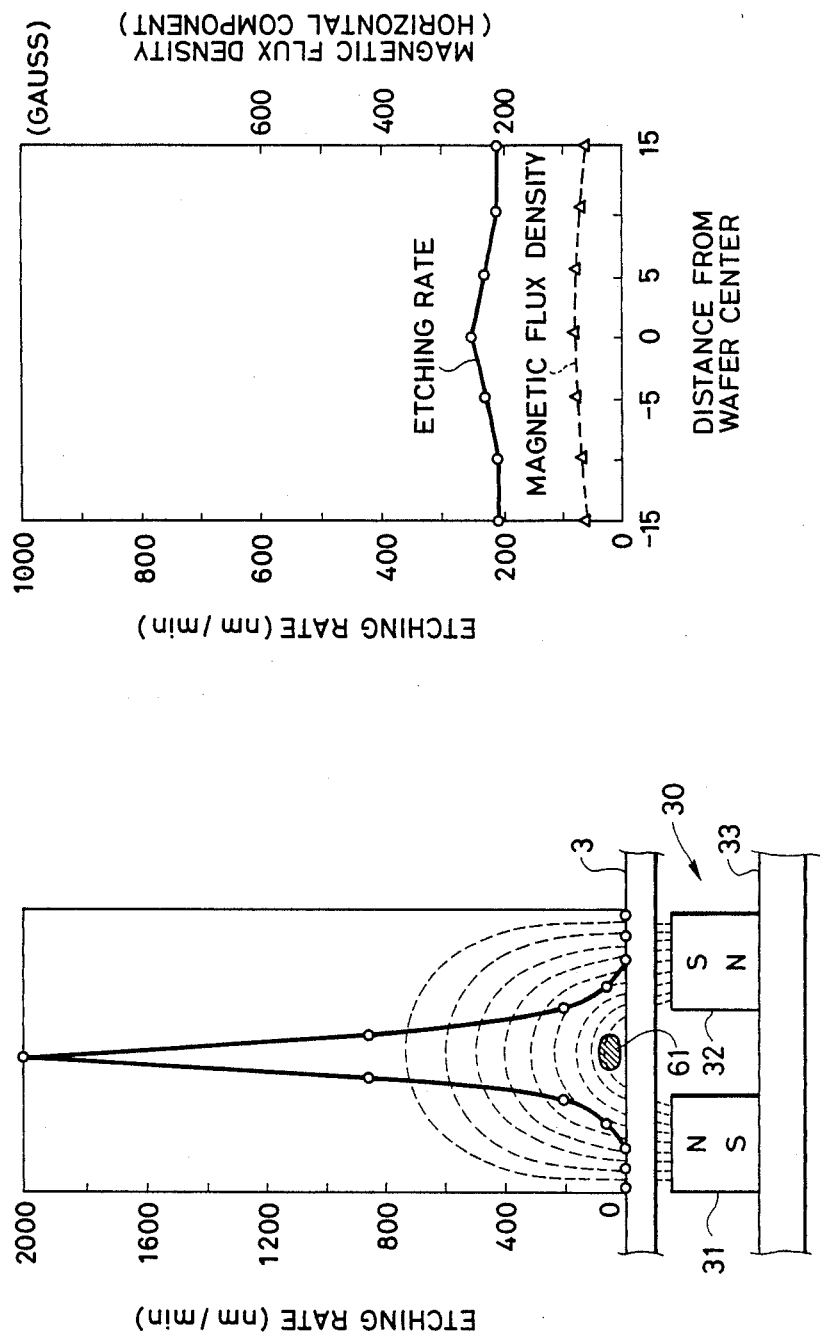

PLASMA TREATING METHOD AND APPARATUS THEREFOR

This application is a continuation application of application Ser. No. 003,026, filed Jan. 13, 1987 abandoned.

BACKGROUND OF THE INVENTION

1. Field of the Invention

The present invention relates to a plasma treating method and apparatus therefor, and more particularly to a plasma treating method and apparatus therefor which is suitable for the treatment of a specimen such as the substrate of a semiconductor device (hereinafter termed as 'wafer') with a plasma.

2. Description of the Prior Art

As a conventional plasma treating apparatus such that a magnetic field is introduced to improve the efficiency of generating a plasma and increase a treating rate, there is well known one by which the treatment is performed particularly with a magnetron discharge generated.

Most of the voltage inside a sheath to be formed on the electrodes for a glow discharge to be generated by using a direct current or a radio-frequency power supply turns out to have an electric field formed perpendicularly to the electrodes. A magnetron discharge is generated by imposing to such an electric field a magnetic field intersecting the electric field orthogonally. Inside the sheath with the electric and magnetic fields intersecting orthogonally, electrons perform a cycloidal motion and the motion of electrons along the direction of the electric field is restricted to a narrow range.

The plasma treating apparatus for the treatment by generating such a magnetron discharge has the following drawbacks.

A first drawback consists in uniformity of the distribution of a treating rate over a full area on the wafer. The intensity of a magnetron discharge depends upon a vector product of an electric field vector E and a magnetic field vector B, $1E \times B1$, and a magnitude of the magnetic field vector $1B$ should be set so that an amplitude in the direction of the electric field when electrons perform the cycloidal motion will be substantially as large as the thickness of the sheath. But, in fact, a scattering of electrons as the result of the collisions between electrons and molecules inside the sheath prevents accomplishment of providing a sufficient effect in converting into a plasma, and, then, a much higher intensity of the magnetic field than should be necessary at such a time will be required. However, it is impossible to obtain such a magnetic field having uniformity through a full area inside the sheath on the wafer, and, consequently, the state of the plasma on the wafer will be uneven, and, as illustrated in FIG. 10, the etching rate becomes locally so high in the portion where a magnetron discharge 61 is generated. Thus, there is a drawback of being unable to have a uniform distribution of the etching rate over the full area on the wafer.

As a method in the attempts of resolving such a drawback and accomplishing a uniform treatment, there is one which is disclosed in U.S. Pat. No. 4,526,643, wherein a plurality of magnets is arranged as to form an endless track and moved in one direction along the endless track, or one which is disclosed in U.S. Pat. No. 4,552,639, wherein the magnetic source consisting of a plurality of permanent magnets radially oriented is eccentrically rotated.

Notwithstanding, there is remained a second drawback that is damaging of the semiconductor device by charged particles, especially by ions. The efficiency of utilization of the applied electric power is so high in the magnetron discharge that the discharge can be maintained by a low voltage, and, consequently, the voltage in the sheath may be made low. Hence, an injection energy of ions in their injection onto the wafer becomes low, and, accordingly, the resultant damaging is said to be low. But, as described in Japanese Patent Publication No. 9394/1986, if an aluminum material is etched, there occurs an objectionable problem that part of the patterns of aluminum, which is covered with a resisting mask and on which etching is not normally done, is destroyed together with the resisting mask.

Generally, the aluminum material is to have layers formed on the Si wafer via $SiO_2$ of an insulation layer. In the magnetron discharge, a potential difference inside the sheath is so high as some hundreds of volt, and a kinetic energy of electrons performing the cycloidal motion inside the sheath reaches more than 100 eV, which is a relatively high level of energy with reference to the level of 10–20 eV for the primary ionization. Owing to this, in the magnetron discharge, electrons having such a high level of energy collide with the molecules of a treating gas so frequently that the association of the molecules will be dissolved. When $BCl_3$ is used as a treating gas, for example, it is ionized into molecules such as $BCl_2^+$ in case of the reactive ion etching (termed hereinafter as 'RIE') while the same is dissociated into atoms such as $B^+ + 3Cl^+$, generating a large number of ions, in case of the magnetron discharge. Hence, in the magnetron discharge, the quantity of ions to be injected on the wafer will become large and they are charged up on the photoresist, and this is considered to destroy part of the aluminum patterns together with the resist. In this way, in the magnetron discharge, ions as dissociated in the form of atoms are generated in large quantities and those ions are injected on the wafer. Therefore, the ions having a greater injection energy and a larger quantity of electric charge, in comparison with the quantity of molecules required for the reaction, will be imposed on the wafer, and this gives rise to a problem of damaging the wafer electrically as well as physically.

Thus, in the magnetron discharge, there has been the drawback of damaging the wafer even after the above referred means for accomplishing good uniformity of the treatment have been put in practice, with a difficulty of achieving a uniform treatment without damaging the wafer.

SUMMARY OF THE INVENTION

An object of the present invention is to provide a plasma treating method and apparatus therefor, by which it is made possible to facilitate a high rate and uniform treatment without damaging the specimen.

The present invention is characterized, by providing a plasma treating apparatus comprising a gas supplying means for supplying a treating gas into a treating chamber, an evacuating means for evacuating the treating chamber to a predetermined pressure, parallel plate electrodes arranged opposite to each other in the treating chamber, with a cathode as one of the parallel plate electrodes to be disposed to be opposed to each other inside the treating chamber, an anode as the other of said parallel plate electrodes, a power supply to be connected to the cathode, so as to generate an electric field between the anode and cathode and a magnetic field generating means for generating a magnetic field starting from a surface of the anode toward the cathode and returning to the anode, wherein the N- and S- poles of the magnetic field generating means face the cathode, with the anode therebetween, and are arranged in proximity to each other such that the magnetic field has relatively short lines of magnetic force crossing at a right angle with the electric field as compared to the length of the lines of magnetic force substantially parallel with the electric field, so as to make a cycloidal motion of electrons restricted and to cause a cyclotronic motion of electrons toward the anode side to occur in large quantities and its treating method, applied as a plasma treating method, comprising a step of supplying the treating gas into the treating chamber having parallel plate electrodes of anode and cathode oppositely faced to each other and evacuating to the predetermined pressure, a step of applying an electric power to the cathode as one of the parallel plate electrodes being opposed to each other inside the treating chamber to thereby generate an electric field between the parallel plates of electrodes, a step of generating the magnetic field starting from the surface of the anode of the parallel plate electrodes toward the cathode, and returning to the anode, the magnetic field being generated by providing N- and S- poles of the magnetic field generating means to face the cathode, with the anode between the N- and S- poles and the cathode, and with the N- and S-poles in proximity to each other such that the magnetic field has relatively short lines of magnetic force crossing at a right angle with the electric field as compared to the length of the lines of magnetic force substantially parallel with the electric field, in the proximity to the cathode, so as to make the cycloidal motion of electrons restricted and to cause the cyclotronic motion of electrons toward the anode side to occur in large quantities, and a step of treating a specimen arranged on the cathode with plasma generated by the cyclotronic motions of the electrons. Thus, it is made possible to facilitate a high rate and uniform treatment without damaging the specimen.

BRIEF DESCRIPTION OF THE DRAWINGS

FIG. 10 is a diagram illustrating the state of discharge and the distribution of an etching rate when a magnetron discharge is generated by providing the magnet element of FIG. 4 on the cathode side.

FIG. 11 is a diagram illustrating the distribution of an etching rate and the distribution of a magnetic flux density when the distance between the magnetic pole face of the magnet element and the cathode relative to FIG. 10 is extended.

DETAILED DESCRIPTION OF THE PREFERRED EMBODIMENT

One embodiment of the present invention will be described with reference to FIGS. 1 through 13.

Figure 1:
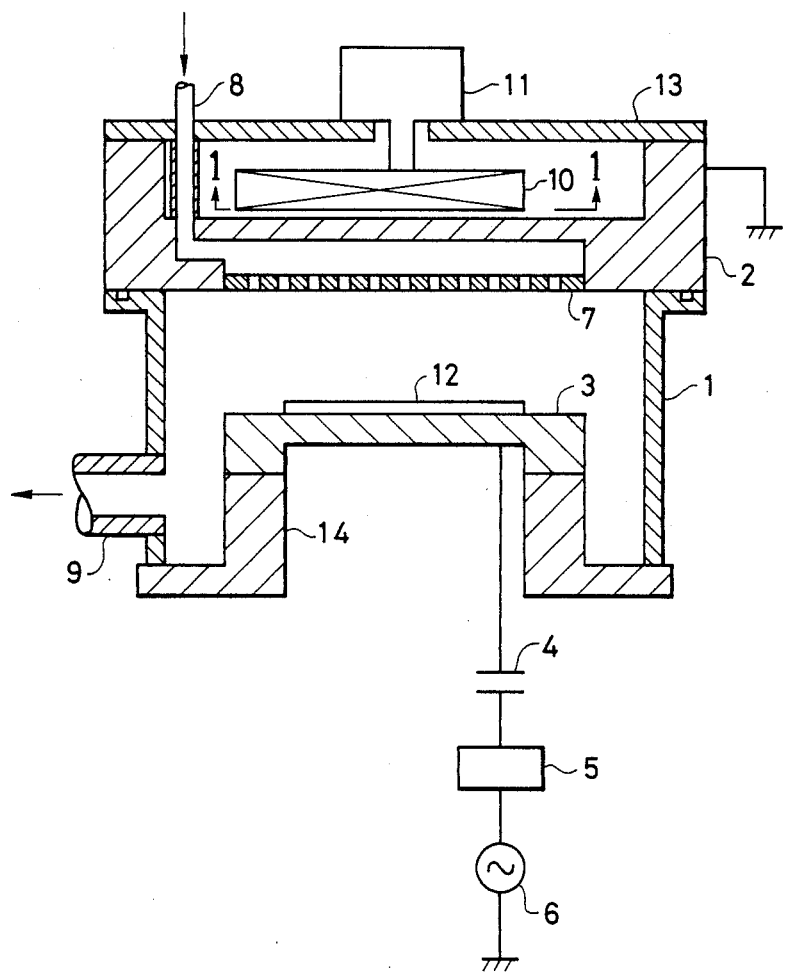
FIG. 1 is a vertical sectional view of the plasma treating apparatus illustrating one embodiment according to the present invention.

FIG. 1 provides combination of a typical RIE apparatus for treating a specimen, i.e. the wafer, with a plasma with the magnetic field generating means according to the present invention. The treating chamber 1 which has a gas-introducing inlet 8 and a gas-exhausting outlet 9 is maintained at a constant low pressure atmosphere by introducing a treating gas via a diffusion plate 7 and exhausting at the same time. The cathode 3, on which side the wafer 12 (6 inch is used in this case) is mounted, is connected to a radio-frequency power supply 6 via a coupling capacitor 4 and a matching box 5. The cathode 3 is installed in the treating chamber 1 by means of a supporting material 14. The anode 2, the diffusion plate 7 and the treating chamber 1 are electrically grounded. The magnet element 10 is installed on a motor 11 via a supporting plate 13 and is disposed on the anode 2 at the counter-cathode 3 side thereof.

Figure 2:
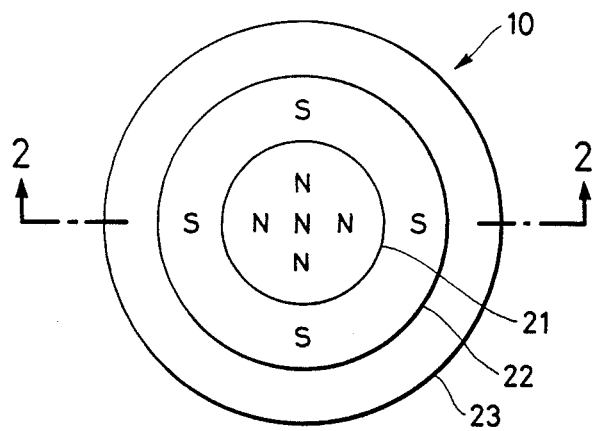
FIG. 2 is a plan view of a magnet element seen along 1—1 in FIG. 1.
Figure 3:
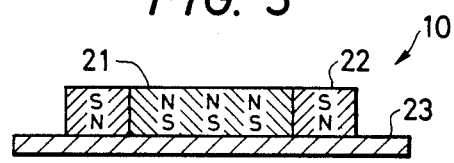
FIG. 3 is a vertical sectional view seen along 2—2 in FIG. 2.

The magnet element 10 consists of permanent magnets 21, 22 and a yoke plate 23 as illustrated in FIGS. 2 and 3. The permanent magnets 21, 22 in this case are made of samarium-cobalt (Sm - Co) and formed by bonding small pieces of magnet as magnetized to have a magnetic flux density of 8,500 gauss. Surrounding the disc-like permanent magnet 21 having a diameter of 80 mm, there is arranged the ring-like permanent magnet 22 having an internal diameter of 80 mm and an external diameter of 180 mm, with their poles to be opposite to each other. As can be appreciated from these magnet dimensions, and as seen in FIGS. 2 and 3, the magnets 21 and 22 contact each other. These permanent magnets are arranged to be installed on the yoke plate 23 made of soft steel and having a diameter of 190 mm. The magnet element 10 and the motor 11 are arranged to be located nonaxisymmetrically with respect to each other, and the magnet element 10 is made rotatable eccentrically. That is, the magnet element 10, for generating a magnetic field between the anode 2 and cathode 3, has the anode 2 between the magnet element 10 and the cathode 3, wherein the magnet element 10 is eccentrically rotated with respect to the specimen, e.g. water 12, arranged on the cathode 3. The rotation center of the magnet element 10 is at the center of the specimen, and the magnetic element 10 is composed of a first magnetic pole which has substantially a shape of a disk, and a second magnetic pole, which has a ringed shape, and which has a polarity opposite to that of said first magnetic pole and surrounds an outer circumference of the first magnetic pole m in proximity thereto.

According to the above described arrangement of the apparatus, a fundamental technology to be attempted by the present invention will be set forth prior to describing the function and the effect of the present invention.

Figure 4:
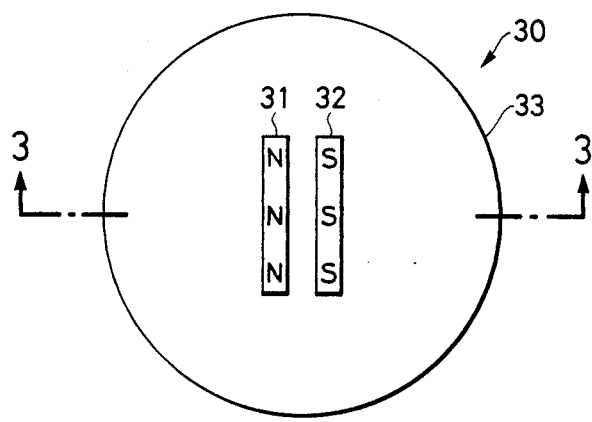
FIG. 4 is a plan view of a magnet element used in experiments.
Figure 5:
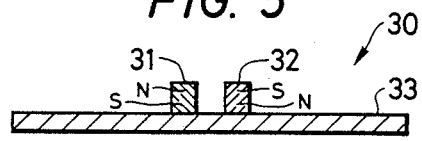
FIG. 5 is a vertical sectional view seen along 3—3 in FIG. 4.

Instead of the magnet element 10 in the apparatus with the above described arrangement, there is set on the anode side a magnet element 30 as illustrated in FIGS. 4 and 5, in which permanent magnets 31, 32 having a width of 10 mm in this case are adjoined with a distance of 20 mm between the centers thereof and installed on the yoke plate 33. In this arrangement, the wafer 12 of 6 inch having a layer of $SiO_2$ formed on the surface thereof is mounted on the cathode 3, a 30 SCCM of $CF_4$ gas as a treating gas is supplied to the treating chamber 1, with the pressure inside the treating chamber 1 being held at 70 m Torr, and a 400 W radio-frequency power of 13.56 MHz is applied by the radio-frequency power supply 6 thereby causing to generate a plasma inside the treating chamber 1 so as to etch the layer of $SiO_2$. In the same arrangement, the distance between the cathode 3 and the magnetic pole face of the magnet element 30 is 40 mm, and a magnetic flux density at the magnetic pole face of the permanent magnets 31, 32 is 8,500 gauss. In this way, the N- and S- poles have magnetizing directions in parallel with the electric field, in parallel with each other, and are arranged in proximity to each other.

Figure 6:
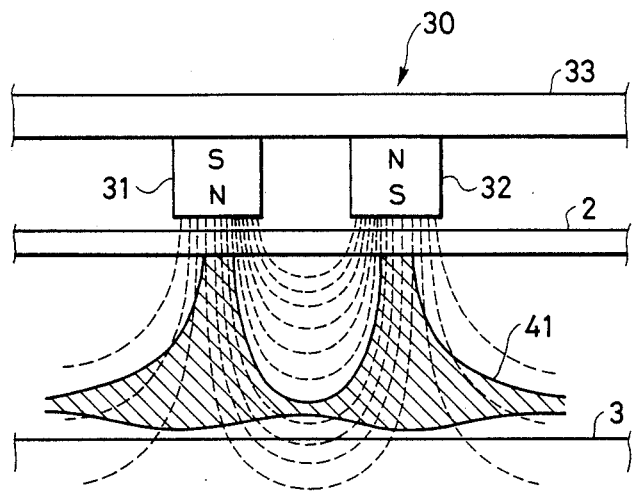
FIG. 6 is a diagram illustrating the state of a plasma generated in experiments using the magnet element in FIG. 4.

By applying the radio-frequency power, a glow discharge is generated between the electrodes consisting of the anode 2 and the cathode 3, and, when on such a glow discharge a magnetic field by the magnet element 30 is imposed, a Lorentz's force is acted on secondary electrons to be derived from the cathode 3 in the portion of a shower-like magnetic field spreading from the anode 2 into the cathode 3, as shown in FIG. 6. Then, a cyclotronic motion is caused to occur in large quantities, in which an intensive plasma region 41 is generated.

It is the fundamental technology of the present invention that such an intensive plasma region 41 is caused to be generated by the cyclotronic motion of electrons.

Figure 8:
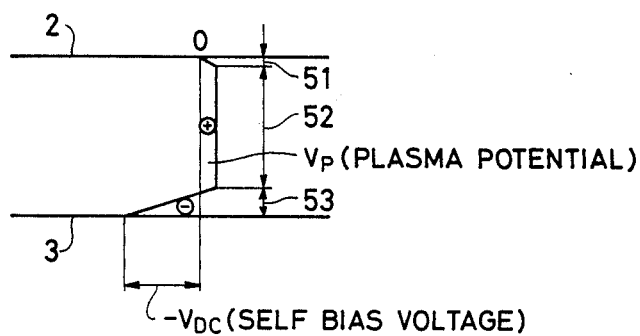
FIG. 8 is a diagram illustrating a potential difference of the component of direct current between the electrodes relative to the state of discharge in FIG. 6.

The distribution of a potential difference of the direct current component between the electrodes is, as illustrated in FIG. 8, divided into an anode sheath portion 51 generated in proximity to the anode 2, which has a potential gradient and a small potential difference, a cathode sheath portion 53 generated in proximity to the cathode 3, which has a potential gradient and a large potential difference, and a plasma portion 52 generated between the anode sheath portion 51 and the cathode sheath portion 53, which has a small potential. Furthermore, as illustrated in FIG. 6, by disposing the magnet element 30 on the anode side, a magnetic field with a high intensity is generated in proximity to the anode 2 and this intensity is gradually weakened toward to the cathode 3. It is secondary electrons having a high energy to generate a high density plasma by supplying an energy to the plasma portion 52, and this portion of the magnetic field causes to change the motion of secondary electrons as described hereinbelow and to transmit the energy had by the secondary electrons to the molecules of a treating gas efficiently.

By the action of such a portion of the magnetic field, the secondary electrons to be generated on the cathode 3 are so accelerated by a self-bias voltage of the cathode sheath portion 53 as to turn to high speed electrons and fly out to the anode 2 side in a direction perpendicularly to the cathode 3. At this time, they approach to a portion of the magnetic field which has a small component positioned to be in parallel to the cathode 3. The magnetic field portion having a slight parallel component means a magnetic field, such as shown in FIG. 6, which is moved away from a point in parallel with the electrode near the cathode, has a component in parallel with the electric field and is directed toward the anode, and wherein lines of magnetic force crossing at a right a angle with the electric field near the cathode are relatively short, as compared to the length of the lines of magnetic force substantially parallel with the electric field. This magnetic field does not have a long portion of lines of magnetic force in parallel with the cathode 3, but rather has lines of magnetic force in an elongated shape such that the lines of magnetic force parallel to the cathode surface are relatively short in length as compared to that in a direction parallel to the electric field. secondary electrons are bestowed a Lorentz's force, thereby the motion of electrons which has been perpendicular to the cathode 3 is changed into a drifting motion toward the anode 2 while performing the cyclotronic motion along the magnetic field. That is, as shown in FIGS. 5 and 6, magnetic poles of permanent magnets are arranged adjacent to each other, so that the magnetic field portion near the cathode has relatively short lines of magnetic force at right angles with the electric field as compared to the length of the lines of magnetic force parallel to the electric field. That is, the magnetic field intersecting substantially orthogonally with the electric field almost disappears near the cathode 3, and even if cycloidal motion of electrons is generated at a point where the electric field and magnetic field are crossed at a right angle to each other, secondary electrons may strike against treating gas molecules momentarily, change their directions, fly away, and approach other magnetic fields having a component in parallel with the electric field, resulting in producing a cyclotronic motion of electrons along the magnetic field. Due to this fact, cycloidal motion does not continue and a magnetron discharge under the cycloidal motion is restricted, but a discharge having mainly a cyclotronic motion is carried out.

Figure 9:
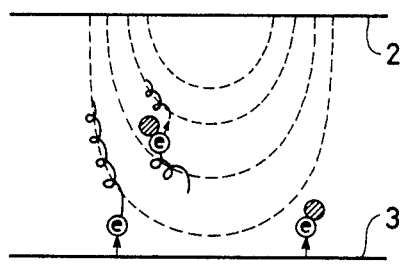
FIG. 9 is a diagram illustrating the process of generating a plasma in the state of discharge in FIG. 6.

Meanwhile, the secondary electrons collide with the molecules of a treating gas, $CF_4$ in this case, as illustrated in FIG. 9, when passing through the plasma portion 52 shown in FIG. 8, by which part of a kinetic energy is given to $CF_4$ to ionize or excite it to produce $CF_3^+$ or reactive species such as $CF_3^*$. The secondary electrons are then going to start flying out in a voluntary direction, but, by receiving the Lorentz's force due to the magnetic field, they start to perform a new cyclotronic motion and drift into the direction of the anode 2 along the magnetic field. By this action, the frequency in which secondary electrons and treating gas molecules strike each other is increased, and energy included in the secondary electrons can be transferred to the molecules of the treating gas with good efficiency above the wafer 12 so that a high density plasma can be generated.

Moreover, in the conventional RIE apparatus, the secondary electrons which are emitted from the cathode 3, accelerated inside the cathode sheath and have a high kinetic energy are apt to advance in a straight line toward the anode 2, so that a time for the secondary electrons to stay in a space is short, a moving distance of secondary electrons in a space becomes short, a degree of frequency collision between the secondary electrons and treating gas molecules is decreased, and an efficiency for applying an energy with the treating gas molecules is decreased, resulting in that a strong plasma is not generated. This high density plasma of the present invention, i.e., a plasma mainly performing a cyclotronic motion, generated by making cyclotronic motion of the secondary electrons with the magnetic field and drifting them toward the anode 2 along the magnetic field (named) "Electron Cyclotron Drifting Discharge" by the inventors and termed hereinafter as 'ECD discharge'), is suitable for treating the wafer comparatively with the magnetron discharge.

Between the magnetic field and the electrons, there is the relationship that the more intensive the magnetic field is, the smaller a radius of the cyclotron motion of electrons and the lower a diffusion rate of electrons will be. If the magnetic field is intensive, electrons are caused to stay in the space long, and, hence, the frequency of collisions between molecules and electrons in the space becomes high.

In case of the conventional, magnetron discharge, the secondary electrons which have flown out from the cathode with a high kinetic energy are caused to perform the cycloidal motion due to an intensive magnetic field intersecting at a right angle with an electric field in proximity to the cathode, this cycloidal motion is continued, and, as the result, ions dissociated in the form of atoms are generated in large quantities. Against this, in the ECD discharge, the magnetic field is composed to become stronger from a location near the cathode toward the anode 2, and, therefore, the frequency of collisions between the secondary electrons generated from the cathode 3 and the molecules of a treating gas is increased gradually toward the direction into the anode 2. Further, the energy which the secondary electrons may have in proximity to the cathode 3 is no less than that in case of the magnetron discharge, which is sufficiently high to be able to dissociate the molecules of the treating gas, However, since the lines of magnetic force orthogonally intersecting the electric field near the cathode are relatively short, the cycloidal motion of the secondary electrons having a high energy is not occurring and the cyclotronic motion is caused, by the magnetic field directed toward the anode 2. Due to this, the quantity of ions as dissociated in the form of atoms by collisions is extremely small in the vicinity of the cathode 3 as compared with the case of the magnetron discharge, because of low frequency of collisions between the secondary electrons and the molecules of the treating gas. Subsequently, as they drift into the direction of the anode 2 from in the vicinity of the cathode 3, the magnetic field becomes intensive step by step and the radius of the cyclotronic motion of secondary electrons becomes smaller and smaller. Accordingly, the frequency of collisions between the secondary electrons and the molecules of the treating gas becomes higher and higher gradually. Thus, the energy had by the secondary electrons is transmitted to the molecules little by little in a broad space above the wafer 12 spreading from the cathode 3 to the anode 2, and molecular ions are generated in large quantities and atomic ions in small quantities.

In this way, in the ECD discharge generated between the cathode 3 to the anode 2 along the magnetic field, the quantity of molecular ions generated is larger than that of atomic ions generated, and such generation occurs in a broad space spreading along the magnetic field, as shown in FIG. 6.

Figure 7:
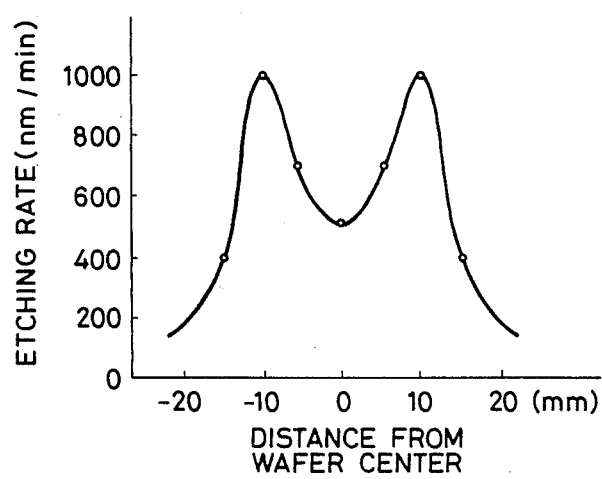
FIG. 7 is a curve showing the distribution of an etching rate relative to the state of the plasma in FIG. 6.

By use of the above described ECD discharge, the etching rate will not become so high locally as in the magnetron discharge, and it can be seen that, as indicated in FIG. 7, there is extended an area which has a considerably high etching rate, e.g. 500 nm/min. The plasma portion 41 in FIG. 6 and the distribution diagram of etching rate in FIG. 7 are drawn to correspond to each other. In these diagrams relative to the ECD discharge, the quantity of the plasma to be generated in the portion where the electric and magnetic fields intersect orthogonally is not very large, and the etching rate becomes lower than the highest level. The highest level of etching rate in the ECD discharge lies in the portions where the plasma is generated in large quantities, namely, where the magnetic field is concentrated substantially in parallel to the electric field, and, in this case, where the permanent magnets 31, 32 are installed. In other words, a plasma having a high degree of ECD discharge is generated below the permanent magnets 31 and 32 emitting magnetic force lines which include relative short lines of magnetic force crossing at a right angle with the electric field as compared to the length of the lines of magnetic force in parallel with the electric field.

Moreover, in the magnetic field by generating the ECD discharge, a large portion of the magnetic field is utilized, and, therefore, the efficiency of utilization is high differently from the magnetic field by generating the magnetron discharge, in which only a portion of the magnetic field where the electric and the magnetic fields intersect orthogonally is utilized.

Then, it will be hereinbelow described that the improvement of etching rate by such ECD discharge is not due to the conventional magnetron discharge.

In the conventional magnetron discharge, for example, a discharge can be generated by setting the magnet element 30 in FIG. 4 on the cathode 3 side at the counter-anode side thereof under the same etching conditions as the ECD discharge is generated. FIG. 10 gives the state of discharge and the distribution of etching rate in this instance, which indicates that, at a portion of the magnetic field above the surface of the cathode 3 where a field portion in parallel to the cathode 3 is most, there is generated a focus discharge 61, and at this portion a tendency of the etching rate shows to be remarkably high. Furthermore, an experiment conducted after extending the distance (to 45 mm) between the cathode 3 and the magnet element 30 set on the cathode 3 side and weakening the magnetic field in the portion above the surface of the cathode 3, showed that there is generated almost no magnetron discharge and almost no increase in the etching rate as indicated in FIG. 11. Namely, it can be seen from FIGS. 10 and 11 that, in case the magnet element 30 is set on the cathode 3 side, no ECD discharge is generated even after changing the distance between the cathode 3 and the magnet element 30. From FIGS. 7 and 10, it can be seen also that the etching rates within the treated surface of the wafer 12 for the ECD discharge and the magnetron discharge are utterly different in their distribution diagram. Besides, in a type that a magnetic field is formed in parallel to the surface of the wafer (the surface of the cathode side thereof) by setting the magnet element on the anode side, as disclosed in U.S. Pat. No. 4,552,639, electrons perform essentially a cycloidal motion, and, therefore no ECD discharge primarily caused by cyclotronic motion of electrons, as in the present invention is generated.

It is the apparatus shown in FIG. 1 such as to be constructed to incorporate the magnet element 10 in FIGS. 2 and 3 therein that the ECD discharge invented by the inventors of the present invention is produced to form a ring so as to attempt to have an intensive plasma generating region spread over the wafer.

By using such an apparatus, for example, under the etching conditions as above specified (the wafer 12 is 6 inch having a SiO$_2$ layer formed on the surface thereof, the supply rate of a treating gas CF$_4$ is 30 SCCM, the pressure inside the treating chamber 1 is 70 m Torr, and the radio-frequency power is 13.56 MHz, 400 W), etching was performed by setting the distance between the electrodes to be 35 mm and the distance between the cathode 3 and the magnetic pole face of the magnet element 10 to be 40 mm.

Figure 12:
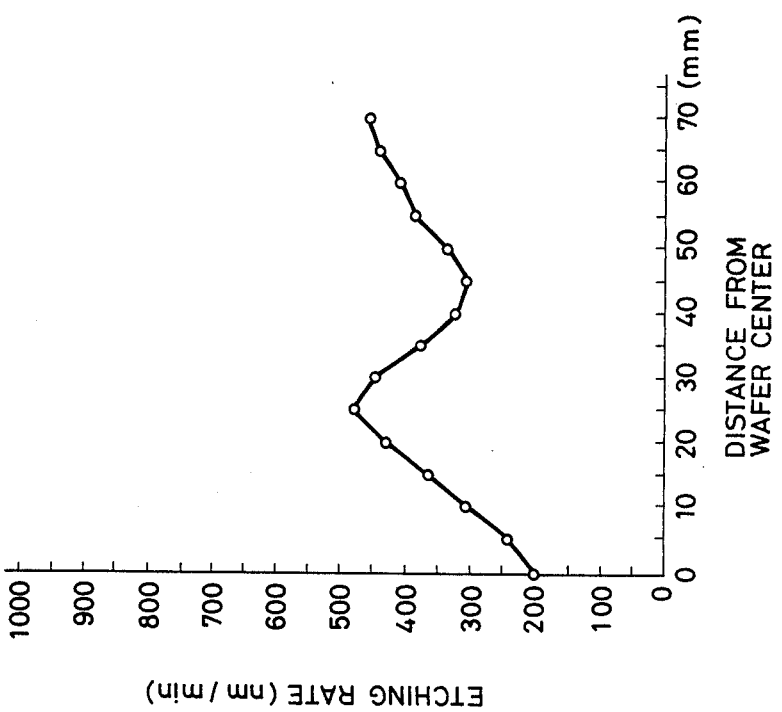
FIG. 12 is a curve showing the distribution of an etching rate when the magnet element in FIG. 2 is used.
Figure 14:
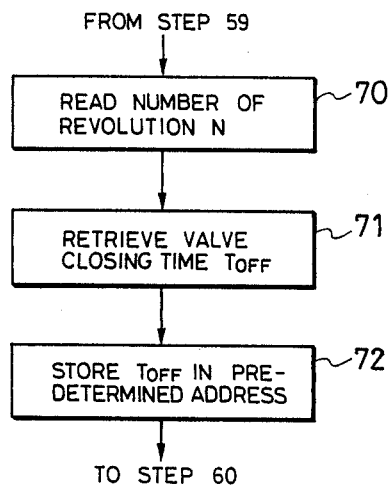
Figure 15:
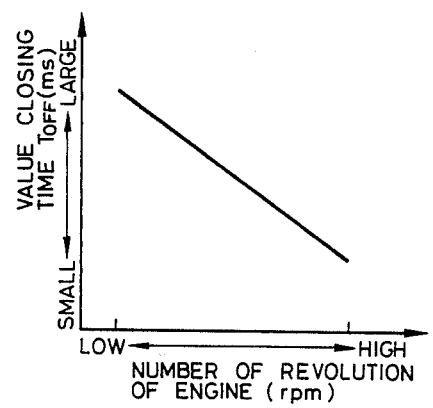

At first, when etching was done by setting the magnet element 10 stably and keeping the centers of the magnet element 10 and the wafer 12 in agreement, the distribution of etching rate showed a wave-like tendency from the center toward the periphery of the wafer as in FIG. 12, where the etching rate at the center of the wafer becomes low. Such a distribution of the etching rate was found similar at any section taken radially to the circumference of the wafer, and although this is more smoothed than the distribution of the magnetron discharge it still can not achieve a satisfactory uniformity.

Figure 13:
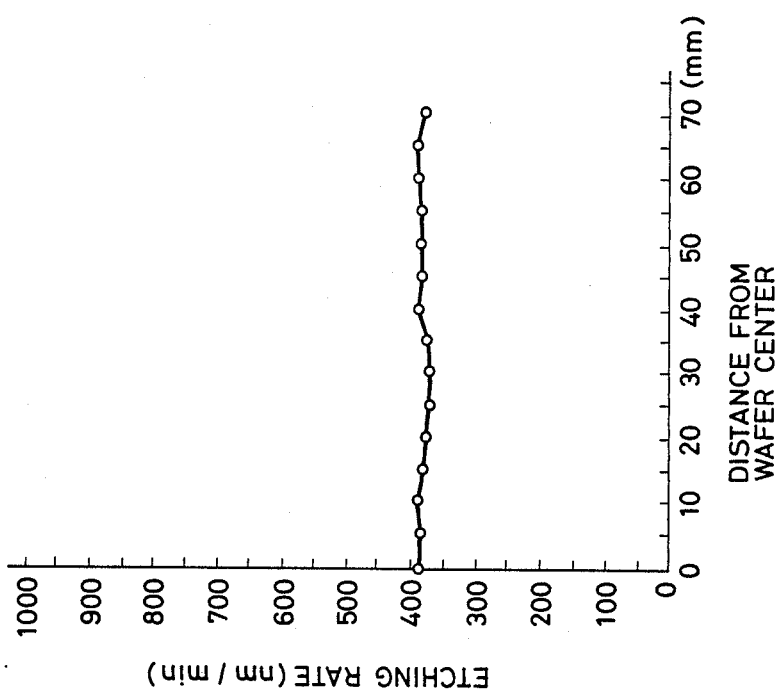
FIG. 13 is a curve showing the distribution of an etching rate when the magnet element in the condition of FIG. 12 is eccentrically rotated.

Secondly, etching was carried out under the same conditions by providing eccentricity in the arrangement of the magnet element 10 with respect to the center of the wafer by 16.5 mm and rotating the magnet element 10 eccentrically on the center of the wafer 12. As the result of this etching, the distribution of etching rate was, as indicated in FIG. 13, substantially uniform from the center toward the periphery of the wafer 12. The above value of eccentricity can be determined for the optimum by mapping transformation of the distribution of etching rate at a still time.

In this case, if the distance between the magnetic pole face of the magnet element 10 and the cathode 3 was made not more than 20 mm and as the distance between the magnet element 10 and the wafer 12 is decreased, a portion near the cathode 3 having the electric field and the magnetic field orthogonally intersecting each other has a certain length, and at the same time a strength of the magnetic field in parallel to the cathode inside the cathode sheath was intensified. With this arrangement a magnetron discharge was generated at a portion where the electric field and the magnetic field near the cathode intersect each other, a portion with a locally high etching rate is generated, and the distribution of etching rate was found remarkably uneven even after rotating the magnet element 10 eccentrically.

As above described, according to the present embodiment, in which a treating gas is converted into a plasma by the ECD discharge and the wafer is treated by etching with such a plasma, the following effects can be provided:

(1) by causing secondary electrons having a high energy to drift into the anode side by the action of the magnetic field while causing the same to perform primarily a cyclotronic motion, that is, by generating a magnetic field by providing N- pole surfaces and S- pole surfaces facing the cathode, with the anode between the N- pole and S- pole surfaces, on the one hand, and the cathode, on the other, and with the N- pole and S- pole having magnetizing directions in parallel with the electric field, in parallel with each other, and in proximity to each other, such that length of lines of magnetic force extending at right angles to the electric field, in the proximity of the cathode, are relatively short compared with that of lines of magnetic force parallel to the electric field, a high density plasma can be obtained thereby providing an effect of enabling to increase the etching rate;

(2) by causing secondary electrons having a high energy to drift into the anode side by the action of the magnetic field while causing the same to perform a cyclotronic motion, a high density plasma can be obtained even by a low power, as much as that in the magnetron discharge. However, since a magnetic field portion having a component in parallel with an electric field substantially occupies a location near the cathode; that is, a portion of the magnetic field orthogonally intersecting the electric field in proximity to the cathode is weakened, the time for which secondary electrons having a high energy may stay in the space near the cathode is short, and, consequently, atomic ions are generated in small quantities and this quantity of atomic ions generated is extremely small in comparison with the magnetron discharge, thereby providing an effect of minimizing damage to the wafer electrically as well as physically;

(3) by causing secondary electrons having a high energy to drift into the anode side by the action of the magnetic field spreading in a shower-like form toward the cathode from the anode while causing the same to perform a cyclotronic motion, a high density plasma (ECD discharge) mainly having a cyclotronic motion in a broad region can be generated, thereby providing an effect of enabling to facilitate a uniform treatment;

(4) by having a magnetic field generating means according to the present invention (that is, a magnetic field generating means for generating a magnetic field between the parallel plate electrodes, wherein the magnetic field generating means includes N- pole surfaces and S- pole surfaces facing the cathode, with the anode between the N- pole S-pole surfaces, on the one hand, and the cathode, on the other, the magnetic field generating means being composed of a first magnetic pole which has substantially a shape of a disk, and a second magnetic pole, which has a ring shape, and which has a polarity opposite to that of the first magnetic pole and surrounds an outer circumference of the first magnetic pole, the inner diameter of the second magnetic pole being equal to the outer diameter of the first magnetic pole, such that lengths of lines of magnetic force extending at right angles to the electric field, in the proximity of the cathode, are relatively short a compared to that of lines of magnetic force extending parallel to the electric field). The ECD discharge can be generated over a full surface of the wafer and a high etching rate can be attained, and, by rotating the magnet element eccentrically, the etching rate can be made further uniform over the full surface of the wafer; and (5) by causing the magnetic field generated between the electrodes to have a component in parallel to the electrodes, secondary electrons are easier to be caught in comparison with the magnetic field having no such a component, and the distance of their induction into the anode side is made longer, thereby enabling to increase the frequency of collisions between the secondary electrons and the molecules of a treating gas and to improve the efficiency of generating a plasma.

Moreover, values of the size and location of the magnet element as specified relative to the present embodiment may be taken only as example, and, a matter of course, the size and location of the magnet element may be selected to be optimum appropriately depending on the varying etching conditions, and changes in the values will be in the purview of the present invention.

Still moreover, if a type of the magnet element has, as illustrated in FIG. 4, the parallel poles and a longer length of the magnet than the diameter of the wafer and it is rotated, the ECD discharge is generated over the full surface of the wafer, and, if the same is rotated eccentrically, a further uniform treatment as in the present embodiment can be accomplished. In this case, however, when one point on the wafer is viewed, the ECD discharge is generated intermittently and so the etching rate becomes lower than the present embodiment.

As above described, according to the present invention. NS poles of the magnet element disposed on the anode side are arranged in proximity to each other, and a magnetic field extends from the surface of the anode toward the cathode and curves back toward the anode, the magnetic field having a component, in parallel to the electric field, that occupies almost all the location near the cathode, with the lines of magnetic force orthogonally intersecting the electric field near the cathode being relatively short as compared to the length of the lines of magnetic force parallel to the electric field so as to make the cycloidal motion of electrons restricted and to cause the cyclotronic motion of electrons to occur in large quantities, to thereby facilitate a high rate of treatment and uniform treatment.

What is claimed is:

1. A plasma treating method comprising a step of supplying a treating gas into a treating chamber and evacuating to a predetermined pressure, the treating chamber including parallel plate electrodes comprised of an anode and a cathode opposed to each other; a step of applying an electric power to the cathode as one of the parallel plate electrodes to thereby generate an electric field between said parallel plate electrodes; a step of generating a magnetic field by providing magnetic field generating means including a first magnetic pole which has substantially a shape of a disc, and a second magnetic pole which has a ring shape, which has a plurality opposite to that of said first magnetic pole and which surrounds an outer circumference of said first magnetic pole, in proximity thereto, the first and second magnetic poles including N-poles and S-poles facing the cathode with the anode between the N-poles and S-poles and the cathode, the N-poles and S-poles being in proximity to each other such that the lengths of lines of magnetic force extending at right angles to the electric field, in proximity to the cathode, are relatively short as compared to that of lines of magnetic force extending substantially parallel to the electric field, so as to restrict cycloidal motion of electrons, and to cause mainly a cyclotronic motion of electrons toward said anode side to occur; and a step of treating a specimen arranged at said cathode by using plasma generated by the cyclotronic motion of electrons.

2. A plasma treating method as defined in claim 1, wherein said plasma is formed in a circular form with respect to a surface of the specimen.

3. A plasma treating method as defined in claim 2, wherein the circular plasma is eccentrically rotated with respect to the specimen.

4. A plasma treating method as defined in claim 1, wherein the magnetic field generating means has a length that is greater than a diameter of said specimen.

5. A plasma treating method as defined in claim 4, wherein said specimen is a semiconductor wafer.

6. A plasma treating apparatus comprising a treating chamber, the treating chamber including parallel plate electrodes comprised of an anode and a cathode opposed to each other; a gas supplying means for supplying a treating gas into the treating chamber; an evacuating means for evacuating said treating chamber to a predetermined pressure; a power supply connected to said cathode, so as to generate an electric field between the anode and cathode; and a magnetic field generating means for generating a magnetic field starting from a surface of said anode toward said cathode and returning to said anode, wherein the magnetic field generating means includes a first magnetic pole which has substantially a shape of a disc, and a second magnetic pole, which has a ring shape, which has a polarity opposite to that of said first magnetic pole and which surrounds an outer circumference of said first magnetic pole, in proximity thereto, the magnetic field generating means including N-poles and S-poles facing the cathode with the anode between the N-poles and S-poles and the cathode, the N-poles and S-poles being arranged in proximity to each other such that lines of magnetic force extending at right angles to the electric field, in proximity to the cathode, are relatively short as compared to that of lines of magnetic force extending substantially parallel to the electric field, so as to restrict cycloidal motion of electrons and to cause mainly a cyclotronic motion of electrons toward said anode side to occur.

7. A plasma treating apparatus as defined in claim 6, wherein said magnetic field generating means is rotatable eccentrically with respect to a specimen disposed on said cathode.

8. A plasma treating apparatus as defined in claim 6, wherein said cathode is a specimen holder, for holding the specimen to be treated in the plasma treating apparatus, the specimen to be held on the surface of the cathode facing the anode.

9. A plasma treating method comprising a step of supplying a treating gas into a treating chamber and evacuating to a predetermined pressure, the treating chamber having included therein opposed parallel plate electrodes including an anode and a cathode; a step of applying electrical power to the cathode as one of the opposing parallel plate electrodes and generating an electric field between said parallel plate electrodes; a step of generating a magnetic field between said parallel plate electrodes so as to generate a plasma between said parallel plate electrodes, the step of generating a magnetic field being performed by providing N-poles and S-poles facing the cathode with the anode between the N-poles and S-poles and the cathode, the magnetic field being generated by a first magnetic pole which has substantially a shape of a disc, and a second magnetic pole having a ring shape and a polarity opposite that of the first magnetic pole, so as to provide the N- and S-poles, the second magnetic pole surrounding the first magnetic pole, the inner diameter of the second magnetic pole being equal to the diameter of the first magnetic pole, such that a length of lines of magnetic force extending at right angles to the electric field, in the proximity of the cathode, is relatively short as compared to that of lines of magnetic force parallel to the electric field, so as to restrict cycloidal motion of electrons and to cause mainly a cyclotronic motion of electrons toward the anode side to occur; and a step of treating a specimen arranged on said cathode using said plasma.

10. A plasma treating method as defined in claim 9, wherein said plasma is formed in a circular form with respect to said specimen surface.

11. A plasma treating method as defined in claim 10, wherein said circular plasma is eccentrically rotated with respect to said specimen.

12. A plasma treating method as defined in claim 9, wherein the first and second magnetic poles are in contact with each other.

13. A plasma treating apparatus comprising a gas supplying means for supplying a treating gas into a treating chamber; an evacuating means for evacuating said treating chamber to a predetermined pressure; parallel plate electrodes composed of a cathode and an anode arranged opposite to each other inside said treating chamber; a power supply connected to said cathode so as to generate an electric field between the anode and cathode; and a magnetic field generating means for generating a magnetic field between said parallel plate electrodes, wherein said magnetic field generating means includes N-poles and S-poles facing the cathode with the anode between the N- and S- poles and the cathode, the magnetic field generating means being composed of a first magnetic pole which has substantially a shape of a disc and a second magnetic pole having a ring shape and a polarity opposite that of the first magnetic pole, so as to provide the N- and S- poles, the second magnetic pole surrounding the first magnetic pole, the inner diameter of the second magnetic pole being equal to the diameter of the first magnetic pole, such that a length of lines of magnetic force extending at right angles to the electric field, in the proximity of the cathode, is relatively short as compared to that of lines of magnetic force parallel to the electric field, so as to restrict cycloidal motion of electrons and to cause mainly a cycloidal motion of electrons toward said anode side to occur.

14. A plasma treating apparatus as defined in claim 13, wherein said cathode is adapted to have a specimen arranged thereon, and wherein said magnetic field generating means is eccentrically rotated with respect to the specimen arranged on said cathode.

15. A plasma treating apparatus as defined in claim 13, wherein the first and second magnetic poles are in contact with each other.

16. A plasma treating apparatus comprising a gas supplying means for supplying a treating gas into the treating chamber; an evacuating means for evacuating said treating chamber to a predetermined pressure; parallel plate electrodes composed of a cathode and an anode arranged opposed to each other inside said treating chamber; a power supply connected to said cathode so as to generate an electric field between the anode and cathode; and a magnetic field generating means for generating a magnetic field between said parallel plate electrodes, having the anode between said magnetic field generating means and the cathode, wherein said magnetic field generating means is eccentrically rotated with respect to a specimen arranged on said cathode, the rotation center of said magnetic field generating means being at the center of said specimen; and wherein the magnetic field generating means is composed of a first magnetic pole which has substantially a shape of a disc, and a second magnetic pole, which has a ring shape and which has a polarity opposite to that of said first magnetic pole and surrounds an outer circumference of said first magnetic pole, in proximity thereto.

* * * * *